US005315246A

United States Patent [19]

Jeffers

[11] Patent Number: 5,315,246

[45] Date of Patent: May 24, 1994

[54] ROTATING SOURCE FOR GENERATING A MAGNETIC FIELD FOR USE WITH A CURRENCY DETECTOR

[75] Inventor: Frederick J. Jeffers, Escondido, Calif.

[73] Assignee: Eastman Kodak Company, Rochester, N.Y.

[21] Appl. No.: 932,114

[22] Filed: Aug. 19, 1992

[51] Int. Cl.$^5$ .................... G01N 27/72; G01R 33/12; G01R 33/06; H01F 7/02

[52] U.S. Cl. .................................. 324/228; 324/235; 324/262; 335/306; 340/551

[58] Field of Search .................... 324/220, 221, 207.2, 324/223, 228, 232, 234, 235, 262; 335/302, 306; 194/210, 213; 235/449, 450; 340/551; 209/567, 569

[56] References Cited

U.S. PATENT DOCUMENTS

| | | | |
|---|---|---|---|
| 2,897,438 | 7/1959 | Fearon | 324/221 |
| 3,015,063 | 12/1961 | Ownby | 324/221 |
| 3,359,495 | 12/1967 | McMaster et al. | 324/235 |
| 4,066,962 | 1/1978 | Jaffe | 324/235 X |
| 4,114,804 | 9/1978 | Jones et al. | 235/449 X |
| 4,458,143 | 7/1984 | Gitlis | 235/449 |
| 4,668,913 | 5/1987 | Vinal | 324/235 |
| 4,764,725 | 8/1988 | Bryce | 324/234 |
| 5,136,239 | 8/1992 | Josephs | 324/235 X |

*Primary Examiner*—Gerard R. Strecker

*Attorney, Agent, or Firm*—Daniel Robbins; William W. Holloway

[57] ABSTRACT

The invention in one embodiment utilizes a pair of identical high energy permanent magnet dipoles mounted on parallel rotatable shafts. The magnetic dipoles lie in a plane perpendicular to the rotatable shafts, and the shafts are coupled to a drive motor for rotation in opposite directions. The magnetic dipoles gives rise to a resultant field which is the sum of the fields due to the individual dipole magnetic moments. With the dipoles aligned, a field having only a longitudinal component is generated, "longitudinal" being defined as being along the direction of initial alignment. The longitudinal components of the two dipoles add, being in the same direction, while the transverse (i.e. perpendicular to the longitudinal direction) components of the dipole cancel, as they point in opposite directions. In the region of space adjacent to the longitudinally defined direction, the longitudinal oriented field components still add, and the transverse components substantially, if not completely, cancel. As the magnetic dipoles counter rotate, the longitudinal components of the dipoles continue to add while the transverse components continue to subtract, giving rise to a uniaxial, sinusoidally varying magnetic field with a frequency equal to the rotational frequency of the dipoles. A second embodiment discloses the use of two pairs of counter rotating dipoles configured to generate a uniaxial, sinusoidally varying magnetic field. Also disclosed is the use of this alternating uniaxial magnetic field source in a system for the detection of currency or other magnetic material.

23 Claims, 2 Drawing Sheets

ROTATING SOURCE FOR GENERATING A MAGNETIC FIELD FOR USE WITH A CURRENCY DETECTOR

BACKGROUND OF THE INVENTION

1. Field of the Invention

This invention relates to a magnetic field source for use in a currency detector, and more particularly to an alternating magnetic field source.

2. Description Relative to the Prior Art

The sensing of the magnetic ink used in currency for the detection of counterfeit bills is known in the art. Examples may be found in U.S. Pat. No. 4,458,143 issued in the name of Gitlis, U.S. Pat. No. 4,114,804 issued in the names of Jones and Sherman, and U.S. Pat. No. 4,764,725 in the name of Bryce. Similarly, apparatus for reading magnetic ink characters on checks has also previously been disclosed, as may be found in U.S. Pat. No. 4,668,913 issued in the name of Vinal.

The above prior art is characterized by a single bill or check passing in close proximity or in actual contact with a magnetic ink detection apparatus. There exists the need, however, for a magnetic ink detector that is neither in contact with a detector nor immediately adjacent to it but that is responsive to the magnetic field associated with a stack of currency. This need to respond to the magnetic field of currency arises for purposes such as detection of stacked currency hidden in luggage or in sealed opaque packages. The requirement mandates a detector that is responsive to magnetic material yet may be as far as 4 to 5 inches away from the package containing currency.

In detecting the presence of a stack of unobservable currency, it is necessary that the detector distinguish the money from other magnetic objects that may be in the package. A unique signature for a stack of currency may be deduced from the coercivity of the magnetic material comprising the magnetic ink. The detection of this unique signature necessitates measuring the hysteresis loop of the magnetic media of the currency. This measurement then allows the determination of the coercivity of the magnetic media.

As is known in the art, measurement of the hysteresis loop of a magnetic material requires the application of a uniaxial alternating magnetic field to the material. Such fields may be generated by means of an AC current through a coil, as taught for example in U.S. Pat. No. 3,359,495. In practice, the magnitude of the field necessary for measuring the coercivity of a stack of currency not in contact with the coil would generally require a large, heavy coil consuming a large amount of ac power. Such a heavy, high power coil would be inconvenient and burdensome to use as a hand held unit. However, the need has been felt to make available a magnetic field generating apparatus as well as a currency field detector which can be implemented as a hand held unit.

SUMMARY OF THE INVENTION

The invention in its simplest embodiment comprises a pair of identical permanent high energy magnet dipoles mounted on parallel rotatable shafts with their magnetic moments initially aligned in the same direction. As will be discussed below, additional magnetic dipoles can be added to increase the resultant magnetic field. In the case of the pair of dipoles, the axes of magnetic dipoles lie in a plane perpendicular to the rotatable shafts, and the shafts are coupled to a drive motor for rotation in opposite directions. The magnetic dipoles give rise to a resultant field which is the sum of the fields due to the individual dipole magnetic moments. With the dipole moments aligned and pointing in the same direction along the line connecting the centers of the dipoles, the field along that line has only a "longitudinal" component. For purposes of this Specification, "longitudinal" is defined as being along the direction of initial alignment, i.e., along the line connecting the center of the dipoles. The longitudinal components of each of the two dipoles add, being in the same direction, while the transverse (i.e. perpendicular to the longitudinal direction) components of the dipoles cancel, as they point in opposite directions. In the region of space adjacent to the line connecting the centers of the dipoles, the longitudinal components still add, and the transverse components substantially, if not completely, cancel. As the magnetic dipoles counter rotate, the longitudinal components of the dipoles continue to add while the transverse components continue to subtract. At fixed points in space along the line connecting the centers of the dipoles, the vector sum of the dipole fields is substantially a uniaxial sinusoidally varying magnetic field lying along the longitudinal direction.

As stated above, the preferred structure is configured for use in a hand held currency detector, and it will be appreciated that as the two magnet dipole assemblies and their associated drive elements are mechanically balanced and are counter rotating, there are no gyroscopic forces resulting from the inertia of the dipole assemblies to be overcome by the user manually sweeping the unit past the package or suitcase under inspection.

When utilized in a system for the detection of currency or of other magnetic material, the alternating uniaxial magnetic field generated by the dipoles is applied to the material under surveillance. Using suitable magnetic field detectors, the system detects and measures the magnetic hysteresis loop of the currency or other magnetic material being surveyed. When compared to the known hysteresis loop of currency or other material under surveillance, the detector determines whether the detected hysteresis loop "matches" the known hysteresis loop of currency or the other material. A "match" indicates the presence of currency or other magnetic material being surveyed whereas the lack of a match indicates the absence of currency or other material under surveillance.

While the invention has been summarized in terms of two magnetic dipoles, it will be noted that the invention may be implemented with additional pairs of appropriately positioned and mechanically balanced dipole assemblies.

DESCRIPTION OF THE PREFERRED EMBODIMENT

Figure 1:
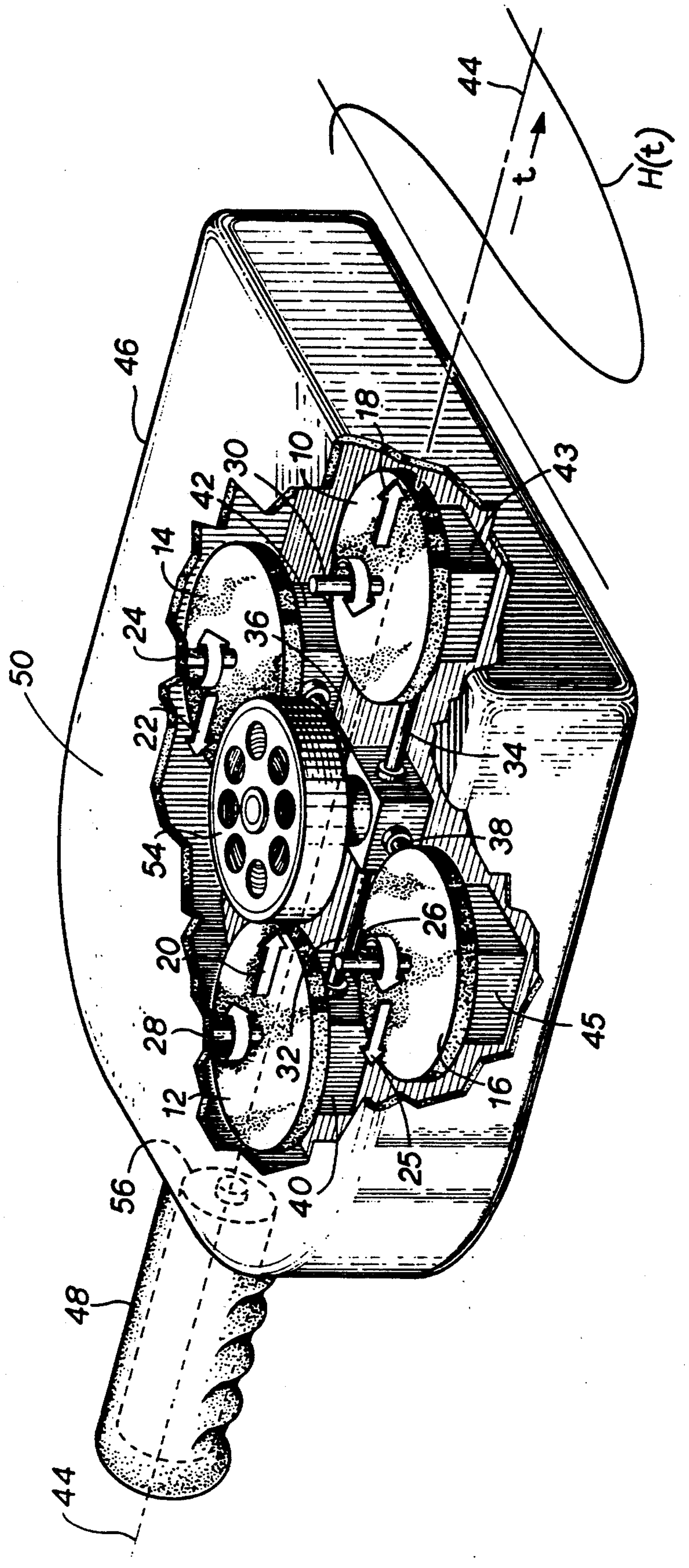
FIG. 1 is a drawing of an alternating magnetic field source according to the invention.

The preferred embodiment of the magnetic field source aspect of the invention utilizes two pairs of counter rotating magnetic dipole assemblies as shown in FIG. 1. Each magnetic assembly comprises a cylindrical disk of magnetic material 10,12,14,16 having rotatable axially positioned parallel shafts 24,26,28,30 perpendicular to the planes of the respective disks. The median planes of the disks 10,12,14,16 lie in a common plane, and the parallel shafts 24,26,28,30 are located at the corners of a quadrilateral in the common plane. The line in the common plane connecting the centers of the disks 10,12 defines the longitudinal direction, 44.

Each disk, fabricated from a magnetic material such as NdFeB, $SmCo_5$, or BaFe magnetized in the plane of the disk so that the resultant field approximates that of a dipole. The rotation of the disks 10,12,14,16 are so phased that their magnetization vectors 18,20,22,25 are aligned and pointing in the longitudinal direction as shown in FIG. 1, once per revolution of the disks. It will be noted for this magnetization alignment that the longitudinal fields of the longitudinally positioned dipoles 10,12 add directly along the longitudinal direction whereas, for the indicated orientations of the magnetizations 22,25 of the off-axis dipoles 14,16, the fringing fields of the dipoles 14,16 add to the fields of the dipoles 10,12 along the longitudinal direction 44.

The drive mechanism for the device is such that the shafts 24,26,28,30 are coupled for equal angular velocity rotation of the disks 10,12,14,16 with disks 12,14 rotating in one direction and disks 10,16 rotating in the opposite direction. The shafts 24,26,28,30 of the disks are coupled to drive shafts, 32,34,36,38 connected by couplings 40,42,43,45 mechanically driven by a battery, 56, energized motor and gearing 54, in a manner known in the art.

As described above, a substantially longitudinal magnetic field, H(t), is generated by the rotating magnetic disks 10,12,14,16. One cycle of magnetic field H(t) occurs for each complete rotation of the disks 10,12,14,16, and the disk rotational speed is such that the magnetic field frequency is at least 5 Hz.

A paddle-like container 46 having a handle 48 contains the components of the alternating field generator. The magnetic disks 10,12,14,16 and their associated drive elements, shafts 24,26,28,30, drive shafts 32,34,36,38 couplings 40,42,43,45 motor and gearing 54 and battery 56 are symmetrically positioned with respect to the centerline of the handle 48, which is also the longitudinal direction of the field H(t). It will be noted that the field H(t) is parallel to the major planar surface 50 of the paddle 46. Thus, as the paddle-like container, 46, is swept about an axis perpendicular to the surface 50, the direction of the field H(t) sweeps out a path parallel to the moving surface 50.

Figure 2:
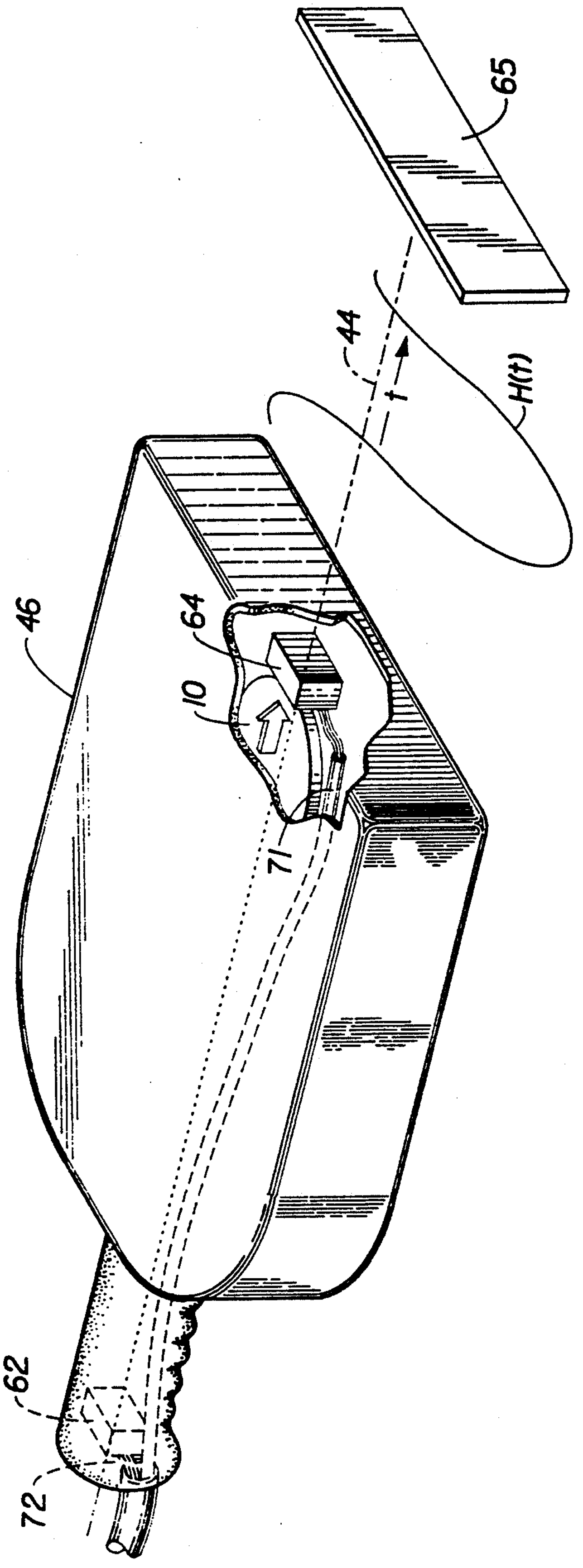
FIG. 2 is a drawing of an alternating magnetic field source which contains magnetic field detectors in accordance with the invention connected to apparatus for detecting and displaying a hysteresis loop.

When used in a system for the detection of currency or of other magnetic material, the uniaxial alternating magnetic field generated by the dipoles is applied to the material, 65, under surveillance. Two field detectors 62,64, such as Hall effect detectors, are mounted in the hand held unit as shown in FIG. 2 along the longitudinal direction of the field: one, 62, remotely positioned so that it responds only to the field generated by the rotating magnetic dipoles and the second, 64, positioned to respond both to the primary field generated by the dipoles and also to the induced field from the magnetic material 65 under inspection. The outputs from each detector 62,64 are wired by dual wires 71,72 to buck each other in a bucking circuit 23 so that the primary field contribution is cancelled, leaving the combined output signal 75 of the detectors proportional to the field contribution of the magnetic material being surveyed. Using methods known in the art, this combined output signal 75 as well as a second signal 77 sourced directly from the remotely-positioned detector can be used to derive the hysteresis loop of the material being surveyed. For example, the induced signal from the surveyed material (i.e., the combined signal 75, may be applied to the vertical plates of an oscilloscope 79, while the signal proportional to the field source itself (i.e., the remotely-positioned signal 77) drives the horizontal plates of the oscilloscope 79. This provides a visual display of the hysteresis loop 81 of the inspected material. If this detected hysteresis loop "matches" the known hysteresis loop of currency or other magnetic material to be surveyed, then positive identification of currency or such other magnetic material can reasonably be inferred.

An implementation of the invention weighed less than 15 lbs, and produced a field along the longitudinal axis of at least 50 Oe. at a distance of 4 inches from the surface 50 of the container 46.

The invention has been described with respect to preferred embodiments thereof, but it will be understood that variations and modifications can be effected within the spirit and scope of the invention. While the preferred embodiment discloses a magnetic disk whose field approximates that of a dipole, it will be understood that the dipole field may also be generated by use of a permanent bar magnet or a by a dipole structure comprised of stacked permanent magnets.

I claim:

1. An alternating magnetic field source comprising:

a) permanent magnet means for generating a magnetic field, said permanent magnet means further comprising at least one pair of coplanar dipole magnets, and b) counter-rotational output parallel shafts driving means, said shafts mechanically coupled to said permanent magnet means for coplanarly counter-rotating at a predetermined angular rate each of said dipole magnets about an axis of rotation perpendicular to said dipole magnet, wherein said alternating magnetic field is the resultant vector sum of the magnetic fields of said pair of dipole magnets, and whereby said alternating magnetic field is substantially uniaxial in a longitudinal direction along a line copolanar with said dipoles and passing through said axis of rotation of said dipoles, and said field varies in a sinusoidal manner at said rotational angular rate.

2. The alternating magnetic field source of claim 1 wherein the frequency of said alternating magnetic field is at least 5Hz.

3. The alternating magnetic field source of claim 1 wherein said permanent magnet means comprises high energy magnetic material selected from the group comprising NdFeB, $SmCo_5$, BaFerrite.

4. A magnetic field source comprising:

a) at least one pair of permanent magnet dipoles, each of said dipoles having a rotational axis perpendicular to said dipole, said axes being parallel and said dipoles being co-planar, b) parallel output shafts drive means having said output shafts each coupled to one of said rotational axes for counter rotating said dipoles about said axes, said drive means being so coupled to said dipoles that the magnetic moments of said dipoles are aligned collinearly twice per revolution of said dipoles, whereby a substantially uniaxial alternating magnetic field is generated by said counter rotating dipoles.

5. The alternating magnetic field source of claim 4 wherein said dipoles are configured as magnetic disks magnetized in the planes of said disks.

6. The alternating magnetic field source of claim 4 wherein the frequency of said alternating magnetic field is at least 5Hz.

7. The alternating magnetic field source or claim 4 wherein said permanent magnet means comprises high energy magnetic material selected from the group comprising NdFeB, $SmCo_5$, BaFerrite.

8. A magnetic field source comprising:

a) a container having a handle thereon, b) a least one pair of permanent magnet dipoles, each of said dipoles having a rotational axis perpendicular to said dipole, said axes being parallel and said dipoles being co-planar, c) parallel output shafts drive means having said output shafts each coupled to one of said dipole axes for counter rotating said dipoles about said axes, said drive means being so coupled to said dipoles that the magnetic moments of said dipoles are aligned collinearly twice per revolution of said dipoles, whereby a substantially uniaxial alternating magnetic field is generated by said counter rotating dipoles, and, d) said counter rotating dipoles and said drive means being mounted in said container in a symmetrical relationship with respect to a plane passing through said handle and said container whereby said counter rotating dipoles and said drive means generate substantially no gyroscopic forces at said handle when said container is placed into motion.

9. The alternating magnetic field source of claim 8 wherein said source weighs less than 15 lbs.

10. The alternating magnetic field source of claim 8 wherein said magnetic field has a frequency of at least 5Hz.

11. The alternating magnetic field source of claim 8 wherein the magnetic field produced at a distance of 4 inches from the leading edge surface of said container is at least 50 Oe.

12. A magnetic field source comprising:

a) a container having a handle thereon, b) a first pair and a second pair of permanent magnet dipoles, each of said dipoles having a rotational axis perpendicular to said dipole, said axes being parallel and said first pair of dipoles and said second pair of dipoles being co-planarly located at the corners of a quadrilateral within said container, with said first pair of dipoles positioned at opposite ends of a first diagonal of said quandrilateral, and said second pair of dipoles positioned at opposite ends of the second diagonal of said quandrilateral, c) parallel output shafts drive means having said output shafts each coupled to one of said dipole axes for counter rotating said first pair of dipoles and for counter rotating said second pair of dipoles, said drive means being so coupled to said dipoles that once per revolution of said first and said second pairs of dipoles, the magnetic moments of said first pair of dipoles are collinearly pointing in the same direction and the magnetic moments of said second pair of dipoles are parallel to and facing in the opposite direction as said magnetic moments of said first pair of dipoles such that the fringing fields of said second pair of dipoles add to the fields of said first pair of dipoles, whereby a substantially uniaxial alternating magnetic field is generated by said counter rotating dipoles, and d) said counter rotating dipoles and said drive means being mounted in said container in a symmetrical relationship with respect to a plane passing through said handle and said container whereby said counter rotating dipoles and said drive means generate no gyroscopic forces at said handle when said container is placed into motion.

13. The alternating magnetic field source of claim 12 wherein said source weighs less than 15 lbs.

14. The alternating magnetic field source of claim 12 wherein said magnetic field has a frequency of at least 5Hz.

15. The alternating magnetic field source of claim 12 wherein the magnetic field produced at a distance of 4 inches from the leading edge surface of said container is at least 50 Oe.

16. A magnetic field source comprising:

a) a container having a handle thereon, b) a first pair and at least one additional pair of permanent magnet dipoles, each of said dipoles having a rotational axis perpendicular to said dipole, said axes being parallel and said additional pairs of dipoles being coplanarly located within said container, c) parallel output shafts drive means having said output shafts each coupled to one of said dipole axes for counter rotating said first pair of dipoles and for counter rotating said additional pair of dipoles, said drive means being so coupled to said dipoles that one per revolution of said first and said additional pairs of dipoles, the magnetic moments of at least said first pair of dipoles are collinearly pointing in the same direction and the magnetic moments of each additional pair of dipoles is parallel to and facing in the opposite direction as said magnetic moments of said first pair of dipoles such that the fringing fields of each additional pair of dipoles add to the fields of said first pair of dipoles, whereby a substantially uniaxial alternating magnetic field is generated by said counter rotating dipoles, and d) said counter rotating dipoles and said drive means being mounted in said containers in a symmetrical relationship with respect to a plane passing through said handle and said container whereby said counter rotating dipoles and said drive means generate substantially no gyroscopic forces at said handle when said container is placed into motion.

17. The alternating magnetic field source of claim 16 wherein said magnetic field has a frequency of at least 5Hz.

18. The alternating magnetic field source of claim 16 wherein the magnetic field produced at a distance of 4 inches from the leading edge surface of said container is at least 50 Oe.

19. The alternating magnetic field source of claim 1 comprising the uniaxial magnetic field in an apparatus for detection and display of the hysteresis loop of an associated magnetic material, said magnetic material positioned in said uniaxial magnetic field, said apparatus further comprising:

b) first magnetic field detection means positioned in said uniaxial field remote from said magnetic material, said first detection means so positioned to be responsive solely to said uniaxial magnetic field, said first detection means further having a first output signal proportional to said uniaxial field, c) second magnetic field detection means positioned to be responsive to the sum of said uniaxial field and said induced field, said second detection means further having a second output signal proportional to said sum, d) signal bucking means for subtracting said first output signal from said second output signal to provide a difference signal proportional to said induced field, and e) two axis display means for inputting said first output signal along one axis of said display means and for inputting said difference signal along a second axis of said display means, whereby said hysteresis loop of said magnetic material is displayed.

20. The magnetic field source of claim 4 comprising the uniaxial magnetic field in an apparatus for detection and display of the hysteresis loop of an associated magnetic material, said magnetic material positioned in said uniaxial magnetic field, said apparatus further comprising:

b) first magnetic field detection means positioned in said uniaxial field remote from said magnetic material, said first detection means so positioned to be responsive solely to said uniaxial magnetic field, said first detection means further having a first output signal proportional to said uniaxial field, c) second magnetic field detection means positioned to be responsive to the sum of said uniaxial field and said induced field, said second detection means further having a second output signal proportional to said sum, d) signal bucking means for subtracting said first output signal from said second output signal to provide a difference signal proportional to said induced field, the e) two axis display means for inputting said first output signal along one axis of said display means and for inputting said difference signal along a second axis of said display means, whereby said hysteresis loop of said magnetic material is displayed.

21. The magnetic field source of claim 8 comprising the uniaxial magnetic field in an apparatus for detection and display of the hysteresis loop of an associated magnetic material said magnetic material positioned in said uniaxial magnetic field, said apparatus further comprising:

b) first magnetic field detection means positioned in said uniaxial field remote from said magnetic material, said first detection means so positioned to be responsive solely to said uniaxial magnetic field, said first detection means further having a first output signal proportional to said uniaxial field, c) second magnetic field detection means positioned to be responsive to the sum of said uniaxial field and said induced field, said second detection means further having a second output signal proportional to said sum, d) signal bucking means for subtracting said first output signal from said second output signal to provide a difference signal proportional to said induced field, and e) two axis display means for inputting said first output signal along one axis of said display means and for inputting said difference signal along a second axis of said display means, whereby said hysteresis loop of said magnetic material is displayed.

22. The magnetic field source of claim 12 comprising the uniaxial magnetic field in an apparatus for detection and display of the hysteresis loop of an associated magnetic material, said magnetic material positioned in said uniaxial magnetic field, said apparatus further comprising:

b) first magnetic field detection means positioned in said uniaxial field remote from said magnetic material, said first detection means so positioned to be responsive solely to said uniaxial magnetic field, said first detection means further having a first output signal proportional to said uniaxial field, c) second magnetic field detection means positioned to be responsive to the sum of said uniaxial field and said induced field, said second detection means further having a second output signal proportional to said sum, d) signal bucking means for subtracting said first output signal from said second output signal to provide a difference signal proportional to said induced field, and e) two axis display means for inputting said first output signal along one axis of said display means and for inputting said difference signal along a second axis of said display means, whereby said hysteresis loop of said magnetic material is displayed.

23. The magnetic field source of claim 16 comprising the uniaxial magnetic field in an apparatus for detection and display of the hysteresis loop of an associated magnetic material, said magnetic material positioned in said uniaxial magnetic field, said apparatus further comprising:

b) first magnetic field detection means positioned in said uniaxial field remote from said magnetic material, said first detection means so positioned to be responsive solely to said uniaxial magnetic field, said first detection means further having a first output signal proportional to said uniaxial field, c) second magnetic field detection means positioned to be responsive to the sum of said uniaxial field and said induced field, said second detection means further, having a second output signal proportional to said sum, d) signal bucking means for subtracting said first output signal from said second output signal to provide a difference signal proportional to said induced field, and e) two axis display means for inputting said first output signal along one axis of said display means and for inputting said difference signal along a second axis of said display means, whereby said hysteresis loop of said magnetic material is displayed.

* * * * *